(12) United States Patent
Kim et al.

(10) Patent No.: US 9,646,945 B2
(45) Date of Patent: May 9, 2017

(54) SEMICONDUCTOR DEVICE HAVING SOLDER JOINT AND METHOD OF FORMING THE SAME

(71) Applicants: Soon-Bum Kim, Suwon-si (KR); Tae-Eun Kim, Hwaseong-si (KR); Eun-Hye Park, Hwaseong-si (KR)

(72) Inventors: Soon-Bum Kim, Suwon-si (KR); Tae-Eun Kim, Hwaseong-si (KR); Eun-Hye Park, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/686,775

(22) Filed: Apr. 14, 2015

(65) Prior Publication Data

US 2016/0027751 A1    Jan. 28, 2016

(30) Foreign Application Priority Data

Jul. 28, 2014 (KR) ........................ 10-2014-0095964

(51) Int. Cl.
*H01L 23/48* (2006.01)
*H01L 23/00* (2006.01)

(52) U.S. Cl.
CPC ............. *H01L 24/13* (2013.01); *H01L 24/11* (2013.01); *H01L 24/16* (2013.01); *H01L 2224/05008* (2013.01); *H01L 2224/05022* (2013.01); *H01L 2224/0562* (2013.01); *H01L 2224/05124* (2013.01); *H01L 2224/05147* (2013.01); *H01L 2224/05567* (2013.01); *H01L 2224/05573* (2013.01); *H01L 2224/05609* (2013.01); *H01L 2224/05613* (2013.01); *H01L 2224/05618* (2013.01); *H01L 2224/05623* (2013.01); *H01L 2224/05639* (2013.01); *H01L 2224/05644* (2013.01); *H01L 2224/05649* (2013.01); *H01L 2224/05655* (2013.01); *H01L 2224/05657* (2013.01); *H01L 2224/05664* (2013.01); *H01L 2224/05666* (2013.01); *H01L 2224/05669* (2013.01); *H01L 2224/05671* (2013.01); *H01L 2224/05672* (2013.01); *H01L 2224/05681* (2013.01); *H01L 2224/11003* (2013.01); *H01L 2224/1111* (2013.01); *H01L 2224/11334* (2013.01); *H01L 2224/11849* (2013.01);

(Continued)

(58) Field of Classification Search
CPC ........... H01L 24/13; H01L 24/16; H01L 24/11
See application file for complete search history.

(56) References Cited

U.S. PATENT DOCUMENTS 4,739,917 A * 4/1988 Baker .................... B23K 1/203
                                                        228/123.1
5,251,806 A * 10/1993 Agarwala ............... H01L 24/11
                                                        228/180.22

(Continued)

*Primary Examiner* — Nicholas Tobergte
(74) *Attorney, Agent, or Firm* — Renaissance IP Law Group LLP

(57) ABSTRACT

Provided is a semiconductor device having a high-reliability solder joint. The semiconductor device includes a high-temperature solder formed on a conductive pad. A low-temperature solder having a lower melting point than the high-temperature solder is formed on the high-temperature solder. A barrier layer is formed between the high-temperature solder and the low-temperature solder. An Sn content of the high-temperature solder is higher than that of the low-temperature solder.

20 Claims, 16 Drawing Sheets

(52) U.S. Cl.
CPC ............... *H01L 2224/13007* (2013.01); *H01L 2224/1308* (2013.01); *H01L 2224/13017* (2013.01); *H01L 2224/13076* (2013.01); *H01L 2224/13083* (2013.01); *H01L 2224/13109* (2013.01); *H01L 2224/13111* (2013.01); *H01L 2224/13113* (2013.01); *H01L 2224/13118* (2013.01); *H01L 2224/13123* (2013.01); *H01L 2224/13124* (2013.01); *H01L 2224/13139* (2013.01); *H01L 2224/13144* (2013.01); *H01L 2224/13149* (2013.01); *H01L 2224/13157* (2013.01); *H01L 2224/13164* (2013.01); *H01L 2224/13166* (2013.01); *H01L 2224/13169* (2013.01); *H01L 2224/13172* (2013.01); *H01L 2224/13181* (2013.01); *H01L 2224/13565* (2013.01); *H01L 2224/13686* (2013.01); *H01L 2224/16058* (2013.01); *H01L 2224/16503* (2013.01); *H01L 2224/8181* (2013.01); *H01L 2224/81193* (2013.01)

(56) References Cited

U.S. PATENT DOCUMENTS

| | | | | |
|---|---|---|---|---|
| 5,641,990 A * | 6/1997 | Chiu | .................... | B23K 35/001 257/737 |
| 5,803,343 A * | 9/1998 | Sarma | .................. | H01L 21/4846 228/180.21 |
| 5,803,344 A * | 9/1998 | Stankavich | .......... | H05K 3/3484 228/180.22 |
| 5,937,320 A * | 8/1999 | Andricacos | ............. | H01L 24/03 257/E23.021 |
| 5,953,623 A * | 9/1999 | Boyko | .................... | H01L 24/13 257/E21.511 |
| 6,281,106 B1 * | 8/2001 | Higdon | ................... | H01L 24/11 257/E21.508 |
| 6,483,195 B1 * | 11/2002 | Aoki | ................... | H01L 21/6835 257/778 |
| 6,492,197 B1 * | 12/2002 | Rinne | ................. | H01L 21/4853 257/737 |
| 6,893,799 B2 | 5/2005 | Danovitch et al. | | |
| 8,348,139 B2 | 1/2013 | Liu et al. | | |
| 2003/0234276 A1 * | 12/2003 | Tsai | .................... | B23K 1/0016 228/180.22 |
| 2005/0199996 A1 | 9/2005 | Ho | | |
| 2007/0036670 A1 | 2/2007 | Pereira | | |
| 2008/0248610 A1 | 10/2008 | Chew et al. | | |
| 2013/0048153 A1 | 2/2013 | Yen et al. | | |
| 2013/0105329 A1 | 5/2013 | Matejat et al. | | |
| 2013/0249109 A1 * | 9/2013 | Ma | ........................ | H01L 23/481 257/774 |

\* cited by examiner

SEMICONDUCTOR DEVICE HAVING SOLDER JOINT AND METHOD OF FORMING THE SAME

CROSS-REFERENCE TO RELATED APPLICATION

This application claims priority under 35 U.S.C. §119 to Korean Patent Application No. 10-2014-0095964 filed on Jul. 28, 2014, the disclosure of which is hereby incorporated by reference in its entirety.

BACKGROUND

Field

Embodiments of the inventive concept relate to a semiconductor device having a high-reliability solder joint.

Description of Related Art

Various methods using solder joints are being studied for electrical connections between semiconductor packages, semiconductor chips, and a main board. Reliability of the solder joint may be determined by structures and materials of a solder post, a solder bump, or a solder ball. Examples of characteristic degradation and lifetime reduction of an electronic system, on which semiconductor chips are mounted, by various types of defects such as cracks observed on the solder joint itself, are being reported.

SUMMARY

Embodiments of the inventive concept provide a semiconductor device having a high-reliability solder joint.

Other embodiments of the inventive concept provide a method of forming a semiconductor device having a high-reliability solder joint.

The technical objectives of the inventive concept are not limited to the above disclosure; other objectives may become apparent to those of ordinary skill in the art based on the following descriptions.

In accordance with an aspect of the inventive concept, a semiconductor device is provided. The device includes a high-temperature solder formed on a conductive pad. A low-temperature solder having a lower melting point than the high-temperature solder is formed on the high-temperature solder. A barrier layer is formed between the high-temperature solder and the low-temperature solder. A tin (Sn) content of the high-temperature solder is higher than that of the low-temperature solder.

In an embodiment, the high-temperature solder may be substantially pure Sn, e.g. more than approximately 99 wt %.

In another embodiment, the high-temperature solder may include a compound containing an Sn content of 90 percent by weight (wt %) or more.

In still another embodiment, the high-temperature solder may not include a flux, whereas the low-temperature solder may include a flux.

In yet another embodiment, a side oxide layer may be formed on a side surface of the high-temperature solder. The side oxide layer may include tin oxide (SnO).

In yet another embodiment, the side surface of the high-temperature solder may include a concave profile. A side surface of the low-temperature solder may include a convex profile.

In yet another embodiment, the profile of the side surface of the high-temperature solder may be substantially linear or straight and substantially perpendicular to an upper surface of the conductive pad in a region thereof adjacent to (may become more linear or straight and perpendicular toward) the barrier layer, and the profile of the side surface of the high-temperature solder may beconcave in a region thereof adjacent to (may become more concave toward) the conductive pad.

In yet another embodiment, the side surface of the high-temperature solder may include a profile which is substantially linear or straight and substantially perpendicular to the upper surface of the conductive pad, and the side surface of the low-temperature solder may include a convex profile.

In yet another embodiment, a first inter-metallic compound (IMC) may be formed between the barrier layer and the high-temperature solder. A second IMC may be formed between the barrier layer and the low-temperature solder.

In yet another embodiment, the barrier layer may include a first barrier layer and a second barrier layer formed on the first barrier layer. The first barrier layer is thicker than the second barrier layer. The first barrier layer may include nickel (Ni). The second barrier layer may include bismuth (Bi).

In yet another embodiment, a first diffusion region may be formed between the second IMC and the low-temperature solder. The first diffusion region may include materials of the second barrier layer and the low-temperature solder.

In yet another embodiment, a third barrier layer may be formed on the first barrier layer. The first barrier layer may be formed between the second barrier layer and the third barrier layer. The third barrier layer may include Bi.

In yet another embodiment, a second diffusion region may be formed between the first IMC and the high-temperature solder. The second diffusion region may include materials of the third barrier layer and of the high-temperature solder.

In accordance with another aspect of the inventive concept, a semiconductor device is provided. The device includes a second conductive pad opposite to a first conductive pad. A high-temperature solder is formed between the first conductive pad and the second conductive pad. A low-temperature solder having a lower melting point than the high-temperature solder is formed between the high-temperature solder and the second conductive pad. A barrier layer is formed between the high-temperature solder and the low-temperature solder. An Sn content of the high-temperature solder is higher than that the Sn content of the low-temperature solder.

In an embodiment, flux residue may be physically proximate (adjacent or close) to the low-temperature solder and the second conductive pad and physically remote (distant or far) from the high-temperature solder and the first conductive pad.

In accordance with still another aspect of the inventive concept, a semiconductor device is provided. The device includes a conductive pad formed on a surface of a semiconductor package. A high-temperature solder is formed on the conductive pad. A low-temperature solder having a lower melting point than the high-temperature solder is formed on the high-temperature solder. A barrier layer is formed between the high-temperature solder and the low-temperature solder. A side surface of the high-temperature solder has a different shape from the shape of the side surface of the low-temperature solder.

In an embodiment, the side surface of the high-temperature solder may include a concave profile.

In another embodiment, the profile of the side surface of the high-temperature solder may be substantially linear or straight and substantially perpendicular to an upper surface of the conductive pad in a region thereof adjacent to (may become more linear or straight and perpendicular toward) the barrier layer, and the profile of the side surface of the high-temperature solder may be concave in a region thereof adjacent to (may become more concave toward) the conductive pad.

In still another embodiment, a side surface of the low-temperature solder may include a convex profile.

In yet another embodiment, the side surface of the high-temperature solder may include a profile that is substantially linear or straight and substantially perpendicular to the upper surface of the conductive pad.

In accordance with yet another aspect of the inventive concept, a method of forming a semiconductor device is provided. The method includes forming a conductive pad, forming a high-temperature solder on the conductive pad, forming a bather layer on the high-temperature solder, and forming a low-temperature solder having a lower melting point than the high-temperature solder on the barrier layer. An Sn content of the high-temperature solder is higher than that the Sn content of the low-temperature solder.

In an embodiment, the forming of the high-temperature solder, the barrier layer, and the low-temperature solder may include forming a film having a through hole on a sacrificial plate, forming the high-temperature solder, the barrier layer, and the low-temperature solder in the through hole, removing the sacrificial plate, bonding the high-temperature solder on the conductive pad, and removing the film.

In another embodiment, the bonding of the high-temperature solder on the conductive pad may be performed using thermo-compression (TC) bonding, thermo-sonic (TS) bonding, or a combination thereof.

In still another embodiment, a surface of the low-temperature solder may be formed into a rounded shape using a reflow process.

In yet another embodiment, the high-temperature solder may include substantially pure Sn, i.e. more than approximately 99 wt %.

In yet another embodiment, the high-temperature solder may not include a flux, whereas the low-temperature solder may include a flux.

In yet another embodiment, a side oxide layer may be formed on the side surface of the high-temperature solder. The side oxide layer may include SnO.

In yet another embodiment, the side surface of the high-temperature solder may include a concave profile, and the side surface of the low-temperature solder may include a convex profile.

In yet another embodiment, the profile of the side surface of the high-temperature solder may be substantially linear or straight and substantially perpendicular to an upper surface of the conductive pad in a region thereof adjacent to (may become more linear or straight and perpendicular toward) the barrier layer, and the profile of the side surface of the high-temperature solder may be concave in a region thereof adjacent to (may become more linear or straight and perpendicular toward) the conductive pad.

In yet another embodiment, the side surface of the high-temperature solder may include a profile that is substantially linear or straight and substantially perpendicular to the upper surface of the conductive pad, and the side surface of the low-temperature solder may include a convex profile.

In yet another embodiment, a first IMC may be formed between the barrier layer and the high-temperature solder. A second IMC may be formed between the bather layer and the low-temperature solder.

In yet another embodiment, the forming of the bather layer may include forming a first barrier layer and forming a second barrier layer on the first barrier layer. The first barrier layer may be thicker than the second barrier layer. The first barrier layer may include Ni. The second bather layer may include Bi.

In yet another embodiment, a first diffusion region may be formed between the second IMC and the low-temperature solder. The first diffusion region may include materials of the second barrier layer and the low-temperature solder.

In yet another embodiment, a third barrier layer may be formed on the first barrier layer. The first barrier layer may be formed between the second barrier layer and the third barrier layer, and the third barrier layer may include Bi.

In yet another embodiment, a second diffusion region may be formed between the first IMC and the high-temperature solder. The second diffusion region may include materials of the third barrier layer and of the high-temperature solder.

Details of other embodiments are included in detailed explanations and the drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
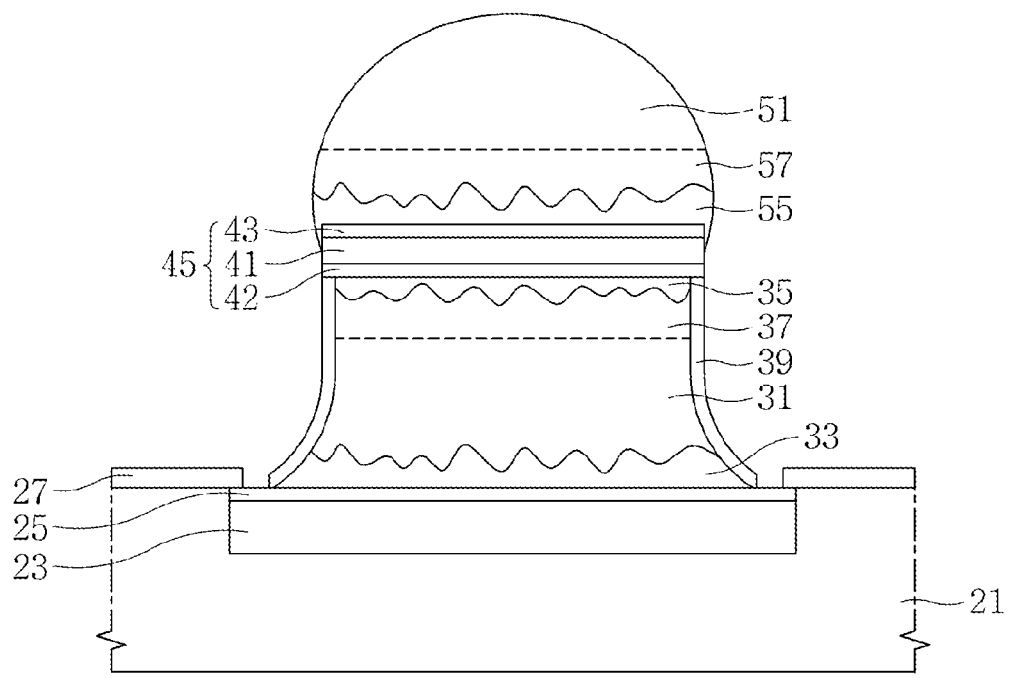
FIGS. 1-13 are cross-sectional views for describing semiconductor devices in accordance with embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass an orientation of either above or below. The device may be otherwise oriented (rotated 90 degrees or at other orientations) and the spatially relative descriptors used herein interpreted accordingly.

The exemplary embodiments of the invention will be described with reference to cross-sectional views and/or plan views, which are ideal exemplary views. Thicknesses of layers and areas may be exaggerated for effective description of the technical contents in the drawings. Forms of the embodiments may be modified by the manufacturing technique and/or dimensional tolerance. Therefore, the embodiments of the invention are not intended to be limited to illustrated specific forms, and include modifications of forms generated according to manufacturing processes. For example, an etching area illustrated at a right angle may be rounded or may have a predetermined curvature. Therefore, areas illustrated in the drawings have overview properties, and shapes of the areas are illustrated special forms of the areas of a device, and are not intended to limit to the scope of the invention.

Hereinafter, like reference numerals in the drawings denote like elements. Therefore, although like reference numerals or similar reference numerals may not be mentioned or described in the drawing, they will be described with reference to the other drawings. Further, although reference numerals may not be illustrated, they will be described with reference to the other drawings.

Terms such as "front side" and "back side" may be used in a relative sense herein to facilitate easy understanding of the inventive concept. Accordingly, "front side" and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side" and "back side" cannot be used interchangeably in the same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

FIGS. 1-13 are cross-sectional views for describing semiconductor devices in accordance with embodiments of the inventive concept.

Referring to FIG. 1, a conductive pad 23 may be formed on a surface of a semiconductor package 21. A high-temperature solder 31, a barrier layer 45, and a low-temperature solder 51 may be formed on the conductive pad 23. The low-temperature solder 51 may have a lower melting point than the high-temperature solder 31. For example, the high-temperature solder 31 may have a higher melting point, by 15 degrees Centigrade (° C.) or more, than the low-temperature solder 51. The low-temperature solder 51 may include a material having a melting point of less than 230° C.

The semiconductor package 21 may selectively include various components, such as a semiconductor chip, a printed circuit board, and an encapsulant, however, descriptions thereof will be omitted for the sake of brevity. The conductive pad 23 may be formed on the printed circuit board in the semiconductor package 21. The conductive pad 23 may correspond to a finger electrode or a landing pad. The conductive pad 23 may include a conductive material such as copper (Cu) or aluminum (Al).

A finish layer 25 may be formed on an upper surface of the conductive pad 23. A thickness of the finish layer 25 may be smaller than that the thickness of the conductive pad 23. The finish layer 25 may cover the upper surface of the conductive pad 23. The finish layer 25 may include nickel (Ni), gold (Au), silver (Ag), platinum (Pt), zinc (Zn), phosphorus (P), indium (In), cadmium (Cd), antimony (Sb), tin (Sn), bismuth (Bi), arsenic (As), chromium (Cr), titanium (Ti), tantalum (Ta), palladium (Pd), cobalt (Co), manganese (Mn), vanadium (V), magnesium (Mg), or the like, or a combination thereof. The finish layer 25 may correspond to a under bump metal (UBM). The finish layer 25 may be disposed between the conductive pad 23 and the high-temperature solder 31.

A package insulating layer 27 such as a solder resist may be formed on a surface of the semiconductor package 21. The package insulating layer 27 may cover outer edges of the finish layer 25. In another embodiment, when the finish layer 25 is omitted, the package insulating layer 27 may cover an outer edge of the conductive pad 23.

The high-temperature solder 31 may include a first intermetallic compound (IMC) 33, a first diffusion region 37, and a second IMC 35. A side oxide layer 39 may be formed on a side surface of the high-temperature solder 31. The barrier layer 45 may include a first barrier layer 41, a second barrier layer 42, and a third barrier layer 43. The low-temperature solder 51 may include a third IMC 55 and a second diffusion region 57.

The high-temperature solder 31 may have a higher melting point than the low-temperature solder 51. The high-temperature solder 31 may include a material having a melting point of 230° C. or more. For example, the high-temperature solder 31 may have a melting point of 250° C. or more. The high-temperature solder 31 may be a compound or an alloy having an Sn content of 90 wt % or more. The high-temperature solder 31 may include substantially pure tin (pure Sn), i.e. more than approximately 9 wt %. The Sn content of the high-temperature solder 31 may be higher (by weight or volume or both) than that the Sn content of the low-temperature solder 51.

The first IMC 33 may be formed between the finish layer 25 and the high-temperature solder 31. The first IMC 33 may include materials of the finish layer 25 and of the high-temperature solder 31. In another embodiment, the first IMC 33 may include materials of the finish layer 25, the conductive pad 23, and the high-temperature solder 31. When the finish layer 25 is omitted, the first IMC 33 may include the materials of the conductive pad 23 and of the high-temperature solder 31.

The first diffusion region 37 may be formed between the second IMC 35 and the high-temperature solder 31. The first diffusion region 37 may include materials of the second barrier layer 42 and of the high-temperature solder 31. The high-temperature solder 31 may be disposed between the first IMC 33 and the first diffusion region 37. In another embodiment, the first diffusion region 37 may be omitted.

The second IMC 35 may be formed between the second barrier layer 42 and the first diffusion region 37. The second IMC 35 may include the materials of the second barrier layer 42 and of the high-temperature solder 31. In another embodiment, the second IMC 35 may include materials of the first barrier layer 41, of the second barrier layer 42, and of the high-temperature solder 31. When the second barrier layer 42 is omitted, the second IMC 35 may include the materials of the first barrier layer 41 and of the high-temperature solder 31.

The side oxide layer 39 may be formed along an exposed surface of the high-temperature solder 31. The side oxide layer 39 may include SnO. The low-temperature solder 51 may include a flux, whereas the high-temperature solder 31 may not include the flux.

The barrier layer 45 may be formed between the high-temperature solder 31 and the low-temperature solder 51. The barrier layer 45 may serve to prevent mixing of the high-temperature solder 31 and the low-temperature solder 51. The barrier layer 45 may include Ni, Au, Ag, Pt, Zn, P, In, Cd, Sb, Sn, Bi, Cu, As, Cr, Ti, Ta, Pd, Co, Mn, V, Mg, Al, or a combination thereof. The first barrier layer 41 may be formed between the second barrier layer 42 and the third barrier layer 43. The first barrier layer 41 may be thicker than the second barrier layer 42 or the third barrier layer 43. For example, the first barrier layer 41 may include Ni, Cu, or the like, or a combination thereof.

The second barrier layer 42 may be disposed between the second IMC 35 and the first barrier layer 41. For example, the second barrier layer 42 may include Bi. In another embodiment, the second barrier layer 42 may diffuse into the second IMC 35 and into the first diffusion region 37. The second IMC 35 may directly contact the first barrier layer 41. The second barrier layer 42 may be omitted.

The third barrier layer 43 may be disposed between the third IMC 55 and the first barrier layer 41. For example, the third barrier layer 43 may include Bi. In another embodiment, the third barrier layer 43 may diffuse into the third IMC 55 and the second diffusion region 57. The third IMC 55 may directly contact the first barrier layer 41. The third barrier layer 43 may be omitted.

The low-temperature solder 51 may have a lower melting point than the high-temperature solder 31. The low-temperature solder 51 may include Sn. The Sn content of the low-temperature solder 51 may be lower than that of the high-temperature solder 31. The third IMC 55 may be formed between the third barrier layer 43 and the second diffusion region 57. The third IMC 55 may include materials of the third barrier layer 43 and the low-temperature solder 51. In another embodiment, the third IMC 55 may include materials of the first barrier layer 41, of the third barrier layer 43, and of the low-temperature solder 51. When the third barrier layer 43 is omitted, the third IMC 55 may include the materials of the first barrier layer 41 and of the low-temperature solder 51.

The second diffusion region 57 may be formed between the third IMC 55 and the low-temperature solder 51. The second diffusion region 57 may include the materials of the third barrier layer 43 and the low-temperature solder 51. The low-temperature solder 51 may be disposed on the second diffusion region 57. In another embodiment, the second diffusion region 57 may be omitted.

A side surface of the low-temperature solder 51 may have a different shape from that of the high-temperature solder 31. A surface of the low-temperature solder 51 may be formed into a rounded shape. A horizontal width (or diameter) of the high-temperature solder 31 may be extended to become close to that the width of the conductive pad 23. The side surface of the high-temperature solder 31 may have a profile that is substantially linear or straight and perpendicular to an upper surface of the conductive pad 23 in a region thereof adjacent to (toward) the barrier layer 45. The side surface of the high-temperature solder 31 may have a concave profile in a region thereof adjacent to (toward) the conductive pad 23. In contrast, the side surface of the low-temperature solder 51 may have a convex profile.

The finish layer 25 may be exposed between the side oxide layer 39 and the package insulating layer 27. In another embodiment, the conductive pad 23 may be exposed between the high-temperature solder 31 and the package insulating layer 27. The conductive pad 23 may have a greater width than the high-temperature solder 31.

In another embodiment, the conductive pad 23 may be formed on a semiconductor chip in the semiconductor package 21. The conductive pad 23 may be formed on a surface of a semiconductor wafer. The conductive pad 23 may be configured as a redistribution layer (RDL).

The high-temperature solder 31, the barrier layer 45, and the low-temperature solder 51 may be configured as a solder post, a solder ball, or a solder bump.

Figure 2:
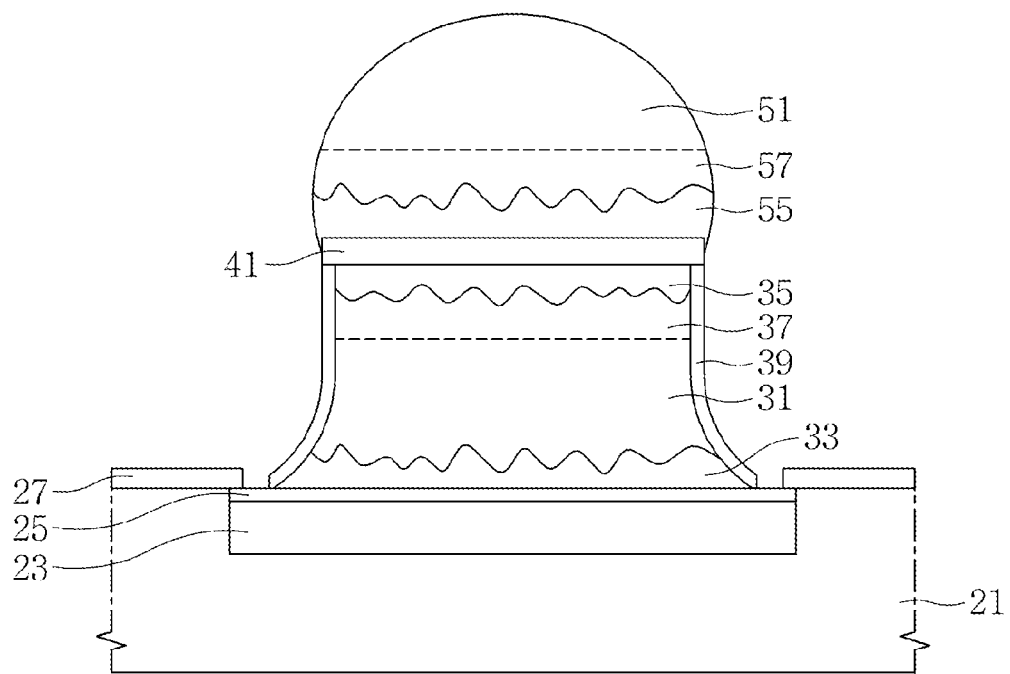

Referring to FIG. 2, a second IMC 35 may directly contact a first barrier layer 41. A third IMC 55 may directly contact the first barrier layer 41. The first barrier layer 41 may be disposed between the second IMC 35 and the third IMC 55.

Figure 3:
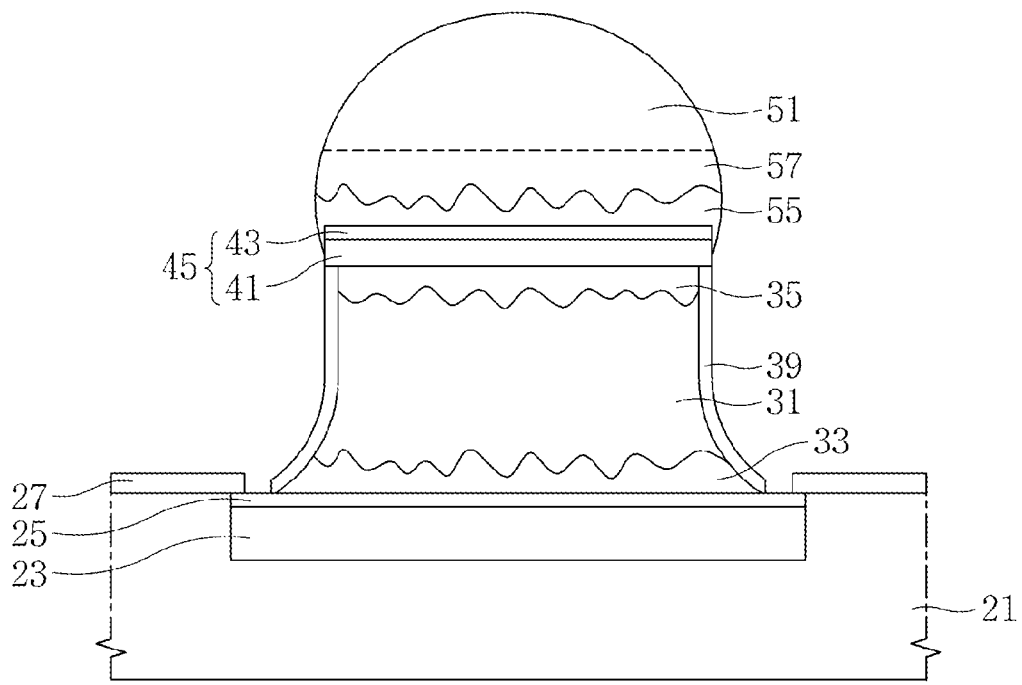

Referring to FIG. 3, a barrier layer 45 may include a first barrier layer 41 and a third barrier layer 43. The second barrier layer 42 (shown in FIG. 1) and the first diffusion region 37 (shown in FIG. 1) may be omitted. A second IMC 35 may directly contact the first barrier layer 41. A third IMC 55 may directly contact the third barrier layer 43.

Figure 4:
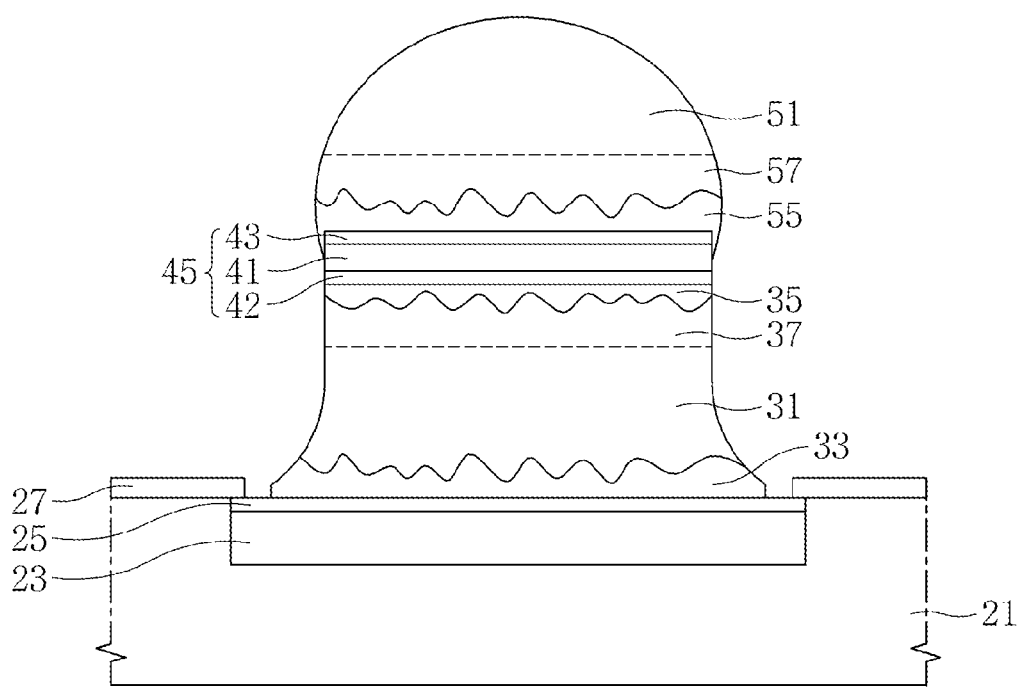

Referring to FIG. 4, a side surface of a high-temperature solder 31 may be exposed. A side oxide layer 39 (shown in FIG. 1) thus may be omitted.

Figure 5:
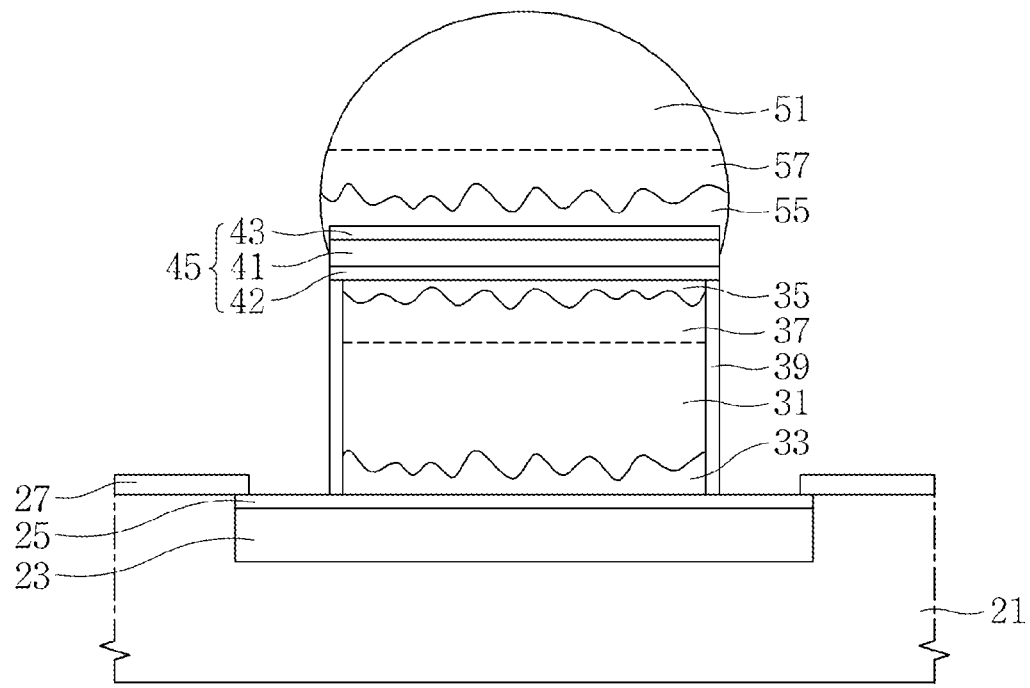

Referring to FIG. 5, the substantially entire side surface of a high-temperature solder 31 may have a profile that is substantially linear or straight and perpendicular to an upper surface of a conductive pad 23. Thus, a concave region of high-temperature solder 31 show in FIGS. 1-4 may be omitted. Consistent with FIGS. 1-4, the side surface of a low-temperature solder 51 may have a convex profile.

Figure 6:
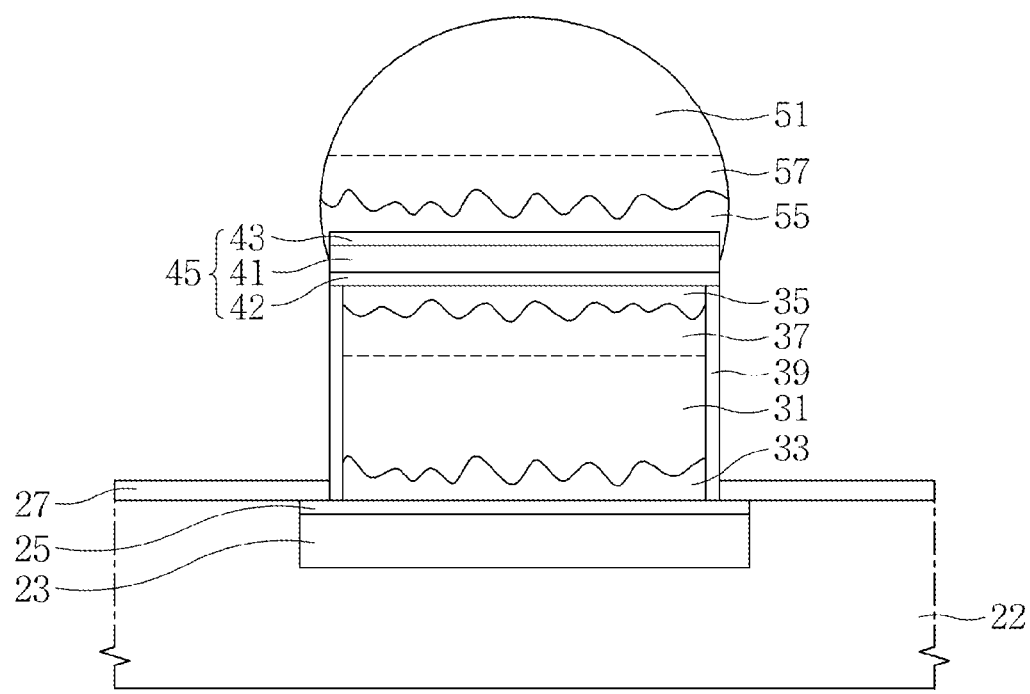

Referring to FIG. 6, a smaller diameter conductive pad 23 may be formed on a semiconductor package 22. The semiconductor package 22 may include a semiconductor wafer or a semiconductor chip. in this embodiment, the conductive pad 23 may be condifured as an RDL. A correspondingly smaller diameter finish layer 25 may be formed on the conductive pad 23. A package insulating layer 27 may be formed on a surface of the semiconductor package 22, and may extend inwardly substantially all the way to the side oxide layer 39. The package insulating layer 27 may cover an edge of the finish layer 25. A high-temperature solder 31, a barrier layer 45, and a low-temperature solder 51 may be formed on the conductive pad 23. The high-temperature solder 31, the barrier layer 45, and the low-temperature solder 51 may be configured as a solder bump. The package insulating layer 27 may contact a side oxide layer 39. the substantially entire side surface of the high-temperature solder 31 may have a profile that is linear or straight and almost perpendicular to an upper surface of the conductive pad 23.

Figure 7:
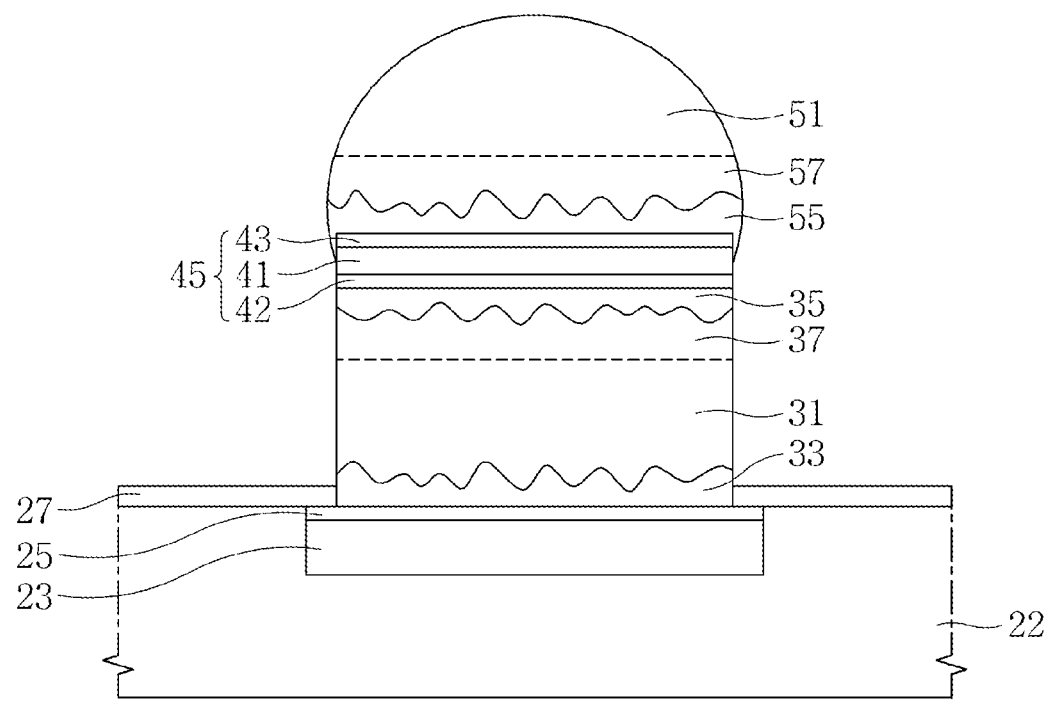

Referring to FIG. 7, the side oxide layer of FIG. 6 may be omitted, and a side surface of a high-temperature solder 31 may be exposed. consistent to the FIGS. 5 and 6 embodiments, the substantially entire side surface of the high-temperature solder 31 may have a profile that is linear or straight and almost perpendicular to an upper surface of a conductive pad 23. In this embodiment, a package insulating layer 27 may extend inwardly substantially all the way to the first IMC 33.

Figure 8:
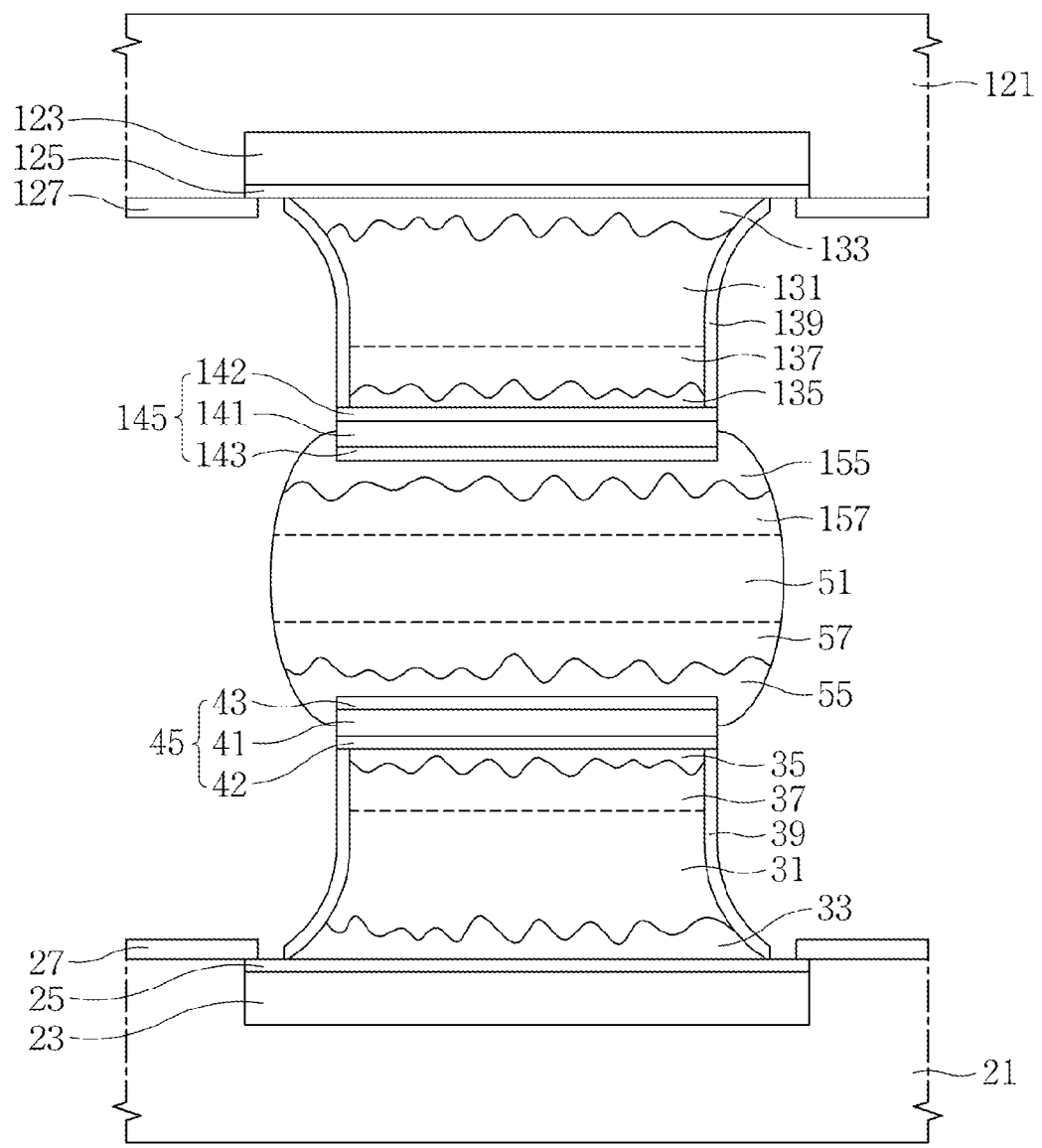

Referring to FIG. 8, an upper semiconductor package 121 may be mounted on a semiconductor package 21. A conductive pad 23 may be formed on a surface of the semiconductor package 21. A finish layer 25 may be formed on the conductive pad 23. A high-temperature solder 31 and a barrier layer 45 may be sequentially stacked atop the finish layer 25. The high-temperature solder 31 may include a first IMC 33, a first diffusion region 37, and a second IMC 35. A side oxide layer 39 may be formed on a side surface of the high-temperature solder 31. The barrier layer 45 may include a first barrier layer 41, a second barrier layer 42, and a third barrier layer 43.

An upper conductive pad 123 may be formed on a surface of the upper semiconductor package 121. An upper finish layer 125 may be formed on the upper conductive pad 123. An upper package insulating layer 127 such as a solder resist may be formed on a surface of the upper semiconductor package 121. The upper package insulating layer 127 may cover an edge of the upper finish layer 125. An upper high-temperature solder 131 and an upper barrier layer 145 may be sequentially stacked beneath the upper finish layer 125. The upper high-temperature solder 131 may include a first upper IMC 133, a first upper diffusion region 137, and a second upper IMC 135. An upper side oxide layer 139 may be formed on a side surface of the upper high-temperature solder 131. The upper barrier layer 145 may include a first upper barrier layer 141, a second upper barrier layer 142, and a third upper barrier layer 143.

The upper high-temperature solder 131, the upper barrier layer 145, the first upper IMC 133, the first upper diffusion region 137, the second upper IMC 135, the upper side oxide layer 139, the first upper barrier layer 141, the second upper barrier layer 142, and the third upper barrier layer 143 may include various configurations similar to those described in FIGS. 1-7.

A low-temperature solder 51 may be formed between the barrier layer 45 and the upper barrier layer 145. The low-temperature solder 51 may include a third IMC 55, a second diffusion region 57, a third upper IMC 155, and a second upper diffusion region 157. A side surface of the low-temperature solder 51 may have a convex profile.

Figure 9:
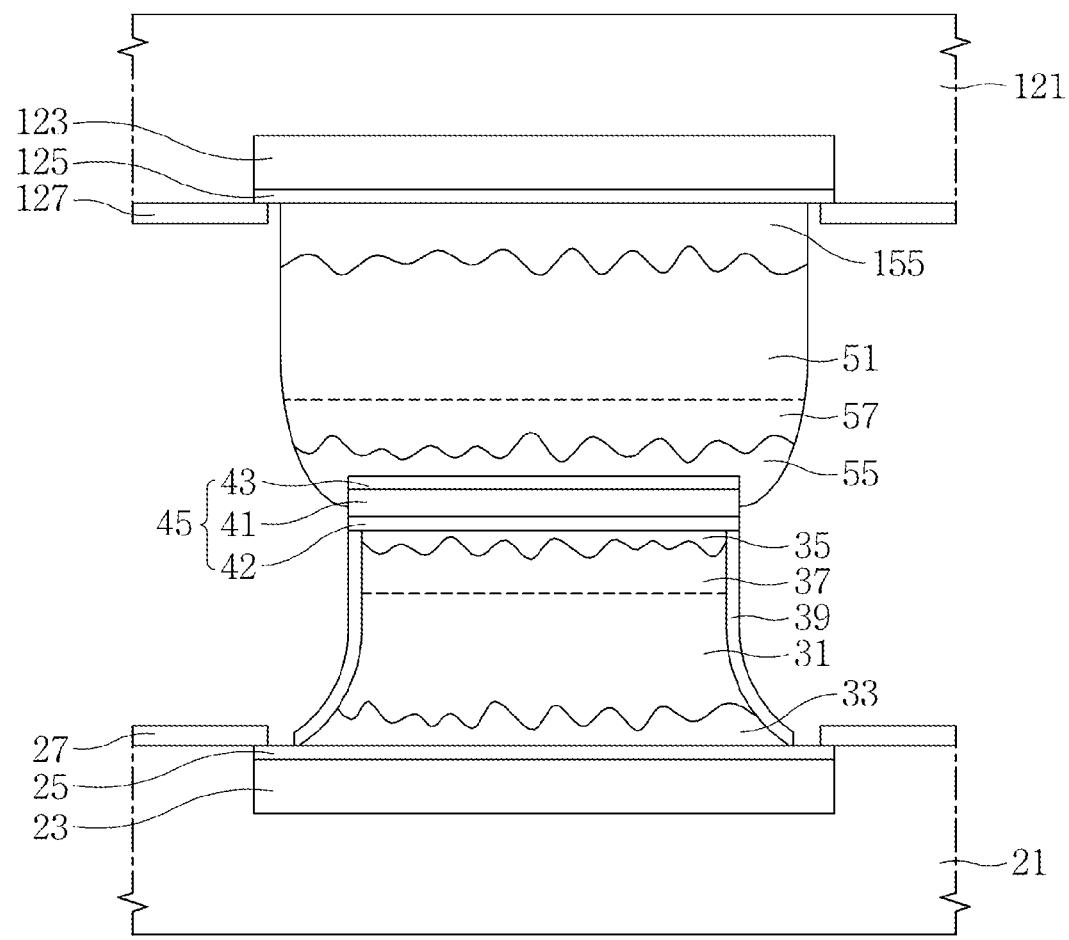

Referring to FIG. 9, a low-temperature solder 51 may be formed between a barrier layer 45 and an upper finish layer 125. A third upper IMC 155 may be formed between the upper finish layer 125 and the low-temperature solder 51. The third upper IMC 155 may directly contact the upper finish layer 125. alternatively, when the upper finish layer 125 is omitted, the third upper IMC 155 may directly contact an upper conductive pad 123.

Figure 10:
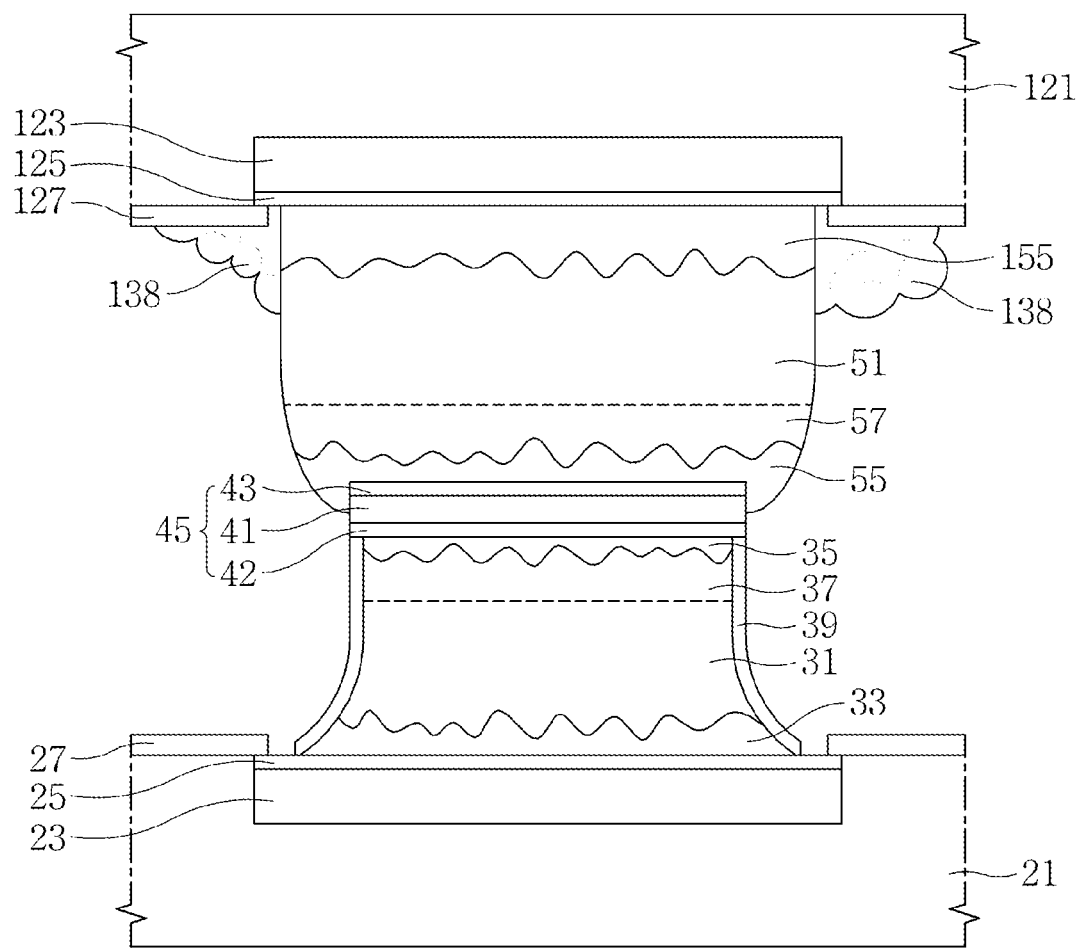

Referring to FIG. 10, a low-temperature solder 51 may include a flux, whereas a high-temperature solder 31 may not include the flux. Flux residue 138 may be attached on a side surface of the low-temperature solder 51 and an upper package insulating layer 127. The flux residue 138 may be seen directly to contact a low-temperature solder 51, a third upper IMC 155, an upper finish layer 125, and the upper package insulating layer 127. The flux residue 138 typically would not be attached around a side oxide layer 39, a finish layer 25, and a package insulating layer 27.

Figure 11:
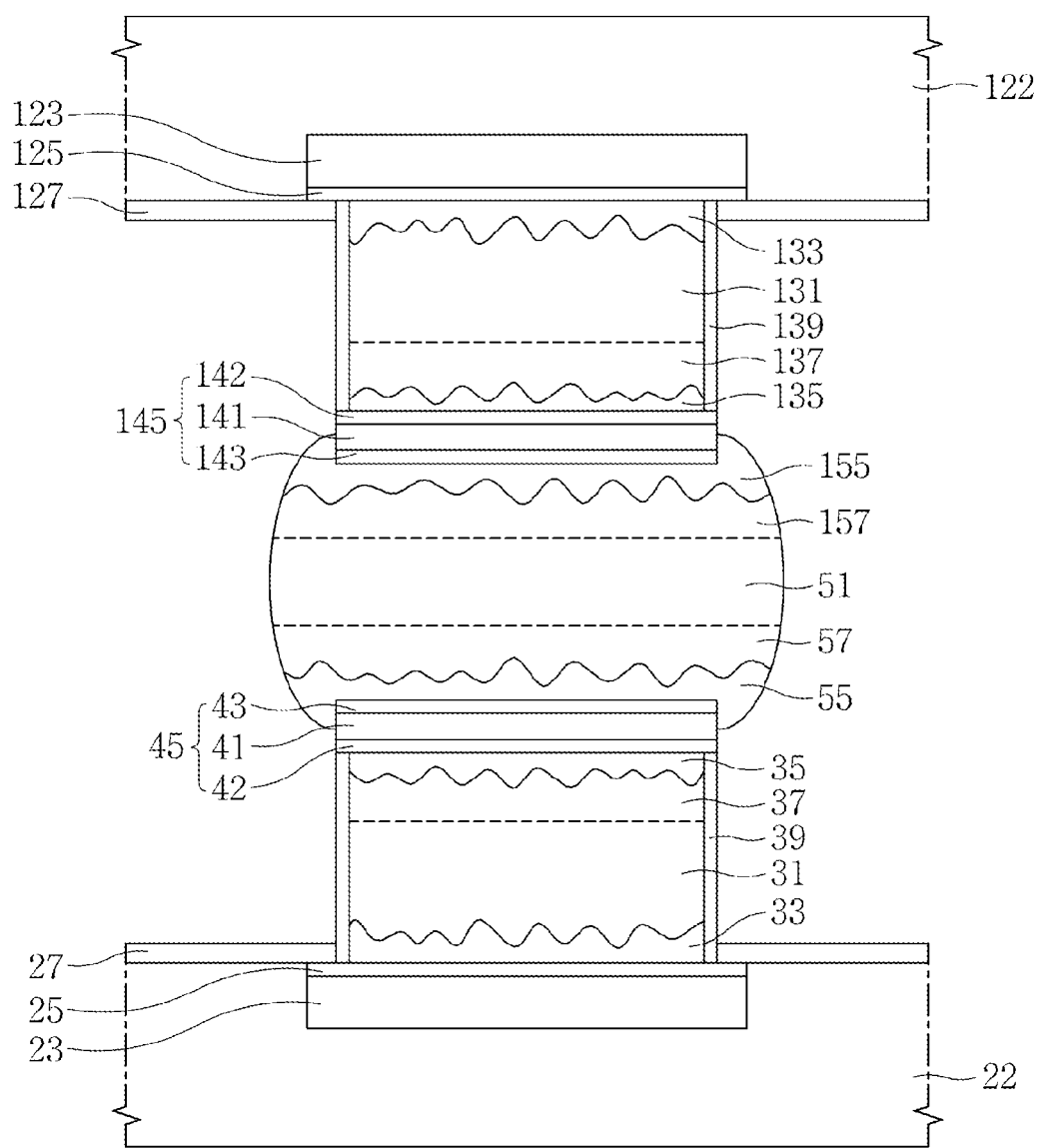

Referring to FIG. 11, a semiconductor package 22; a conductive pad 23; a finish layer 25; a high-temperature solder 31; a first IMC 33; a first diffusion region 37; a second IMC 35; a side oxide layer 39; a barrier layer 45 including a first barrier layer 41, a second barrier layer 42, and a third barrier layer 43; an upper semiconductor package 122; an upper conductive pad 123; an upper finish layer 125; an upper package insulating layer 127; an upper high-temperature solder 131; a first upper IMC 133; a first upper diffusion region 137; a second upper IMC 135; an upper side oxide layer 139; and an upper barrier layer 145 including a first upper barrier layer 141, a second upper barrier layer 142, and a third upper barrier layer 143 may be seen to include various configurations similar to these described in FIG. 6.

A low-temperature solder 51 may be formed between the barrier layer 45 and the upper barrier layer 145. The low-temperature solder 51 may include a third IMC 55, a second diffusion region 57, a third upper IMC 155, and a second upper diffusion region 157. A side surface of the low-temperature solder 51 may have a convex profile.

Figure 12:
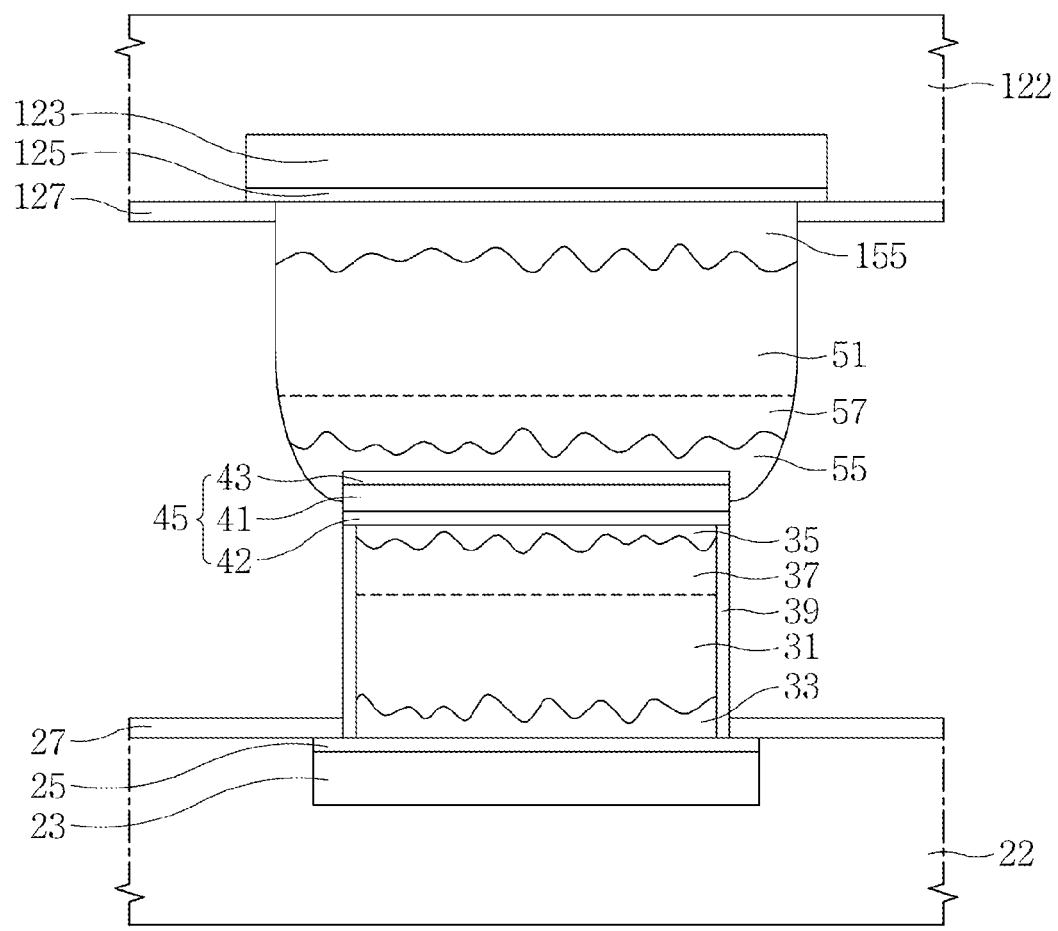

Referring to FIG. 12, a low-temperature solder 51 may be formed between a barrier layer 45 and an upper finish layer 125. A third upper IMC 155 may be formed between the upper finish layer 125 and the low-temperature solder 51. The third upper IMC 155 may directly contact the upper finish layer 125. When the upper finish layer 125 is omitted, the third upper IMC 155 may directly contact an upper conductive pad 123. An upper package insulating layer 127 may directly contact the third upper IMC 155.

Figure 13:
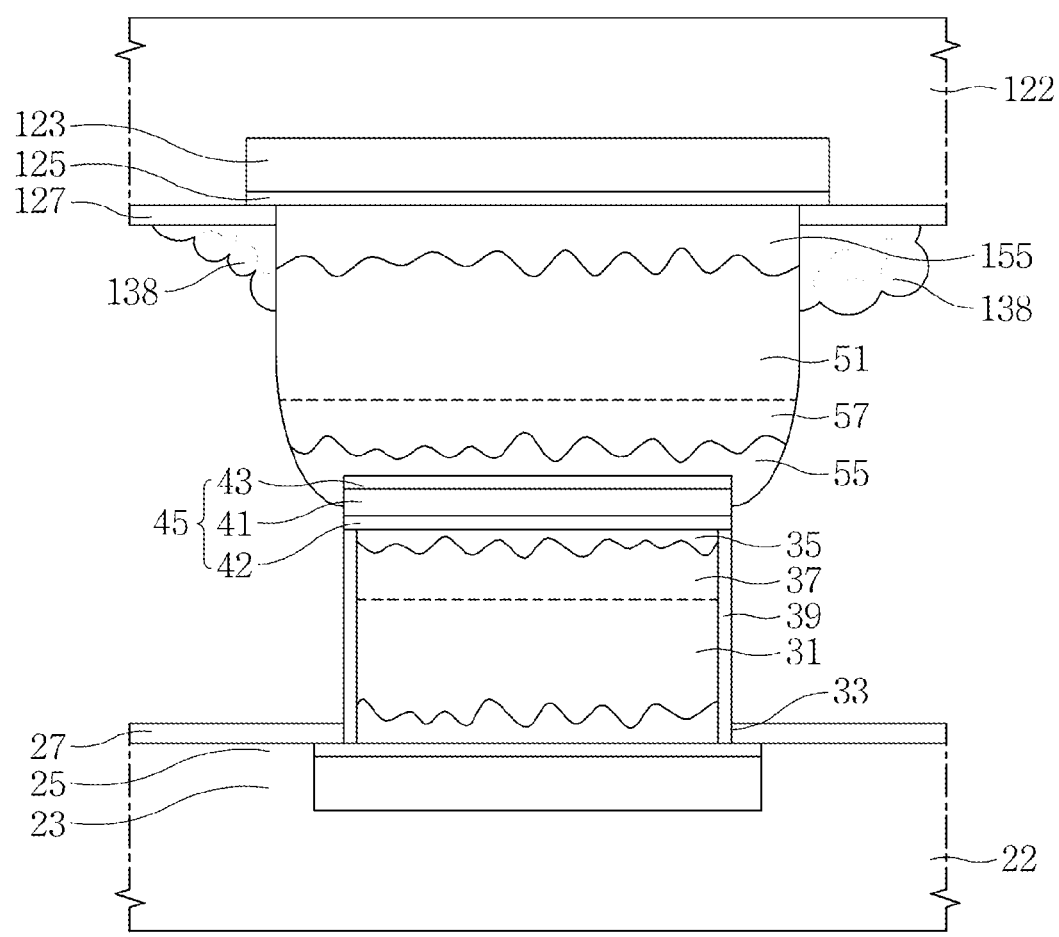

Referring to FIG. 13, a low-temperature solder 51 may include a flux, whereas a high-temperature solder 31 may not include the flux. Flux residue 138 may be attached on a side surface of the low-temperature solder 51 and an upper package insulating layer 127. The flux residue 138 may not be attached around a side oxide layer 39 and a package insulating layer 27.

FIGS. 14-25 are cross-sectional views for describing methods of forming the semiconductor devices in accordance with the embodiments of the inventive concept.

Figure 14:
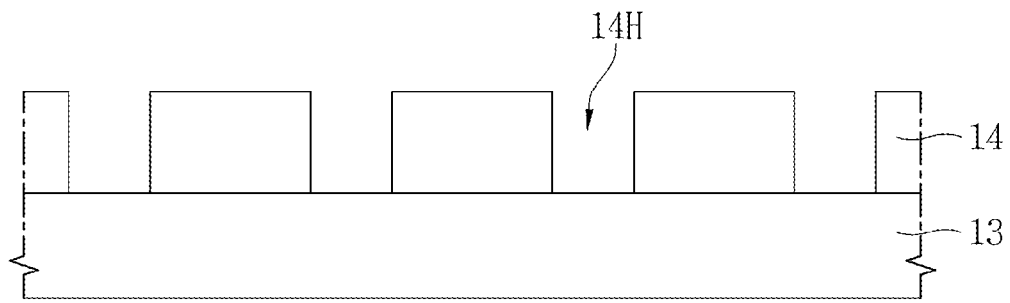
FIGS. 14-25 are cross-sectional views for describing methods of forming the semiconductor devices in accordance with the embodiments of the inventive concept.

Referring to FIG. 14, a film 14 having a plurality of through holes 14H may be formed on a sacrificial plate 13. The sacrificial plate 13 may include a glass plate, a metal plate, a plastic plate, a ceramic plate, or a combination thereof, of which at least an upper surface is planar. The film 14 may include a synthetic resin. The film 14 may include a flexible film. For example, the film 14 may include a dry film. The through holes 14H may be spaced apart from each other. A surface of the sacrificial plate 13 may be exposed at the bottoms of the through holes 14H.

Figure 15:
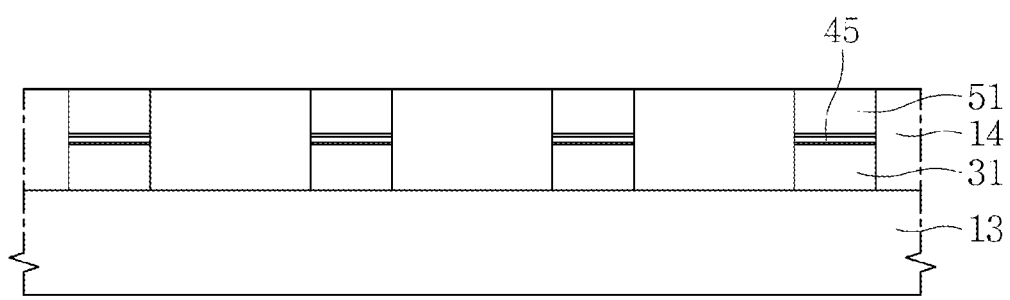

Referring to FIG. 15, a high-temperature solder 31, a barrier layer 45, and a low-temperature solder 51 may be formed in the through hole 14H. The high-temperature solder 31 may contact the sacrificial plate 13. The barrier layer 45 may be formed on the high-temperature solder 31. The low-temperature solder 51 may be formed on the barrier layer 45. An upper surface area of the low-temperature solder 51 may be exposed.

Figure 16:
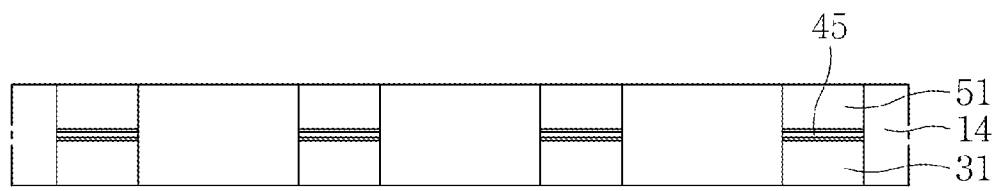

Referring to FIG. 16, the sacrificial plate 13 may be removed to expose a bottom of the high-temperature solder 31. The high-temperature solder 31, the barrier layer 45, and the low-temperature solder 51 thus may be configured as a solder post.

Figure 17:
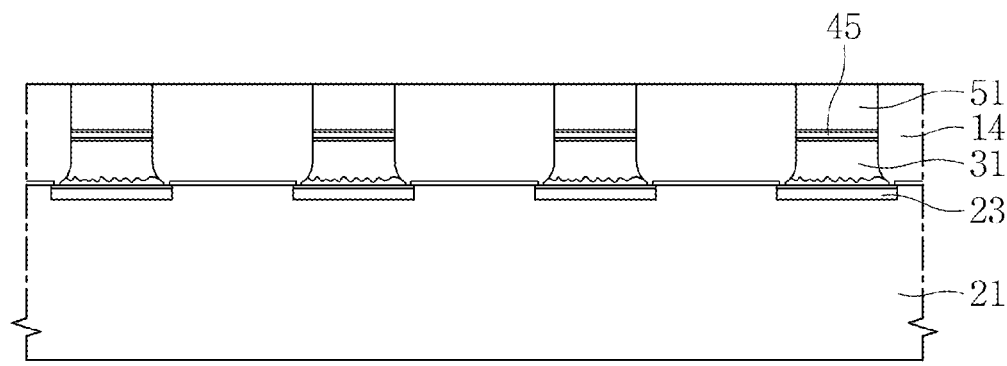

Referring to FIG. 17, the high-temperature solder 31 may be attached on a conductive pad 23.

The conductive pad 23 may be formed on a surface of a semiconductor package 21. Thermo-compression (TC) bonding, thermo-sonic (TS) bonding, or the like, or a combination thereof may be used in a process of attaching the high-temperature solder 31 on the conductive pad 23. A horizontal width (or diameter) of the high-temperature solder 31 may be extended outwardly to be close to the horizontal width (or diameter) of the conductive pad 23. Side surfaces of the high-temperature solder 31 may have a different shape from those of the low-temperature solder 51. The side surfaces of the high-temperature solder 31 may have a profile that is substantially linear or straight and perpendicular to an upper surface of the conductive pad 23 in a region thereof adjacent to (toward) the barrier layer 45. The side surfaces of the high-temperature solder 31 may have a concave profile in a region thereof adjacent to (toward) the conductive pad 23.

In another embodiment, the conductive pad 23 may be formed on a surface of a semiconductor chip or a semiconductor wafer.

Figure 18:
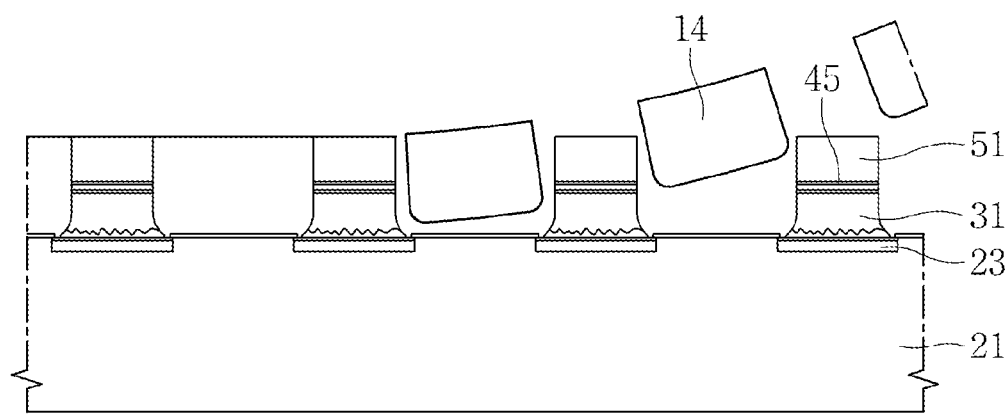

Referring to FIG. 18, the film 14 may be removed.

Figure 19:
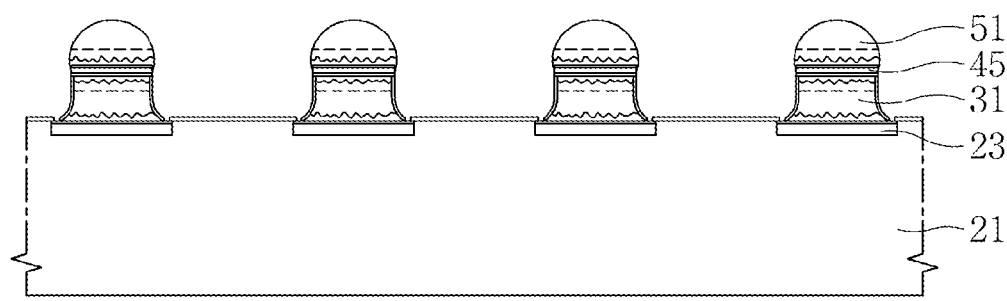

Referring to FIG. 19, a surface of the low-temperature solder 51 may be formed into a rounded shape using a reflow-process. FIGS. 1-4 are enlarged and more detailed views showing a part of the semiconductor device of FIG. 19. The conductive pad 23, the high-temperature solder 31, the barrier layer 45, and the low-temperature solder 51 may be configured similarly to those described in FIGS. 1-4.

Figure 20:
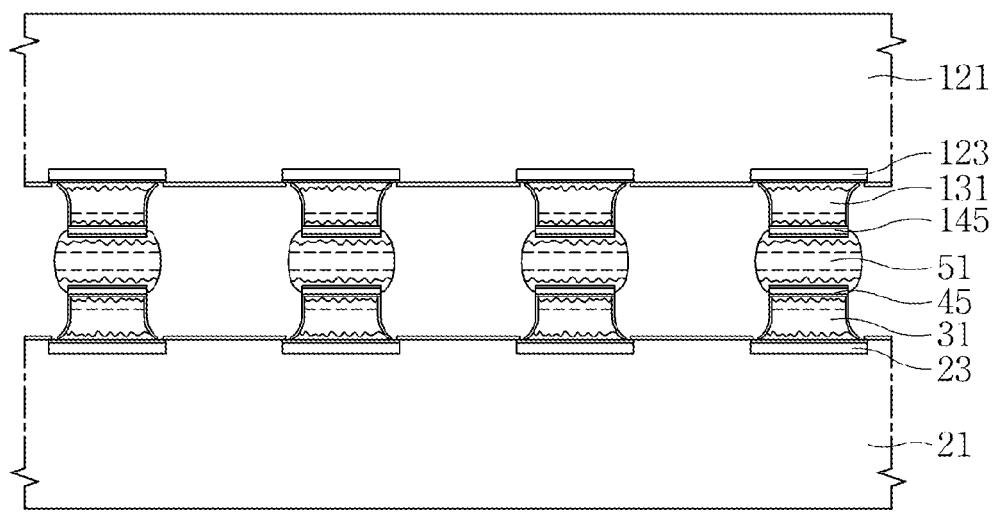

Referring to FIG. 20, an upper semiconductor package 121 may be mounted on the semiconductor package 21. FIG. 8 is an enlarged and more detailed view showing a part of the semiconductor device of FIG. 20. The conductive pad 23, the high-temperature solder 31, the barrier layer 45, the low-temperature solder 51, the upper conductive pad 123, the upper high-temperature solder 131, and the upper barrier layer 145 may be configured similarly to those described in FIG. 8.

Figure 21:
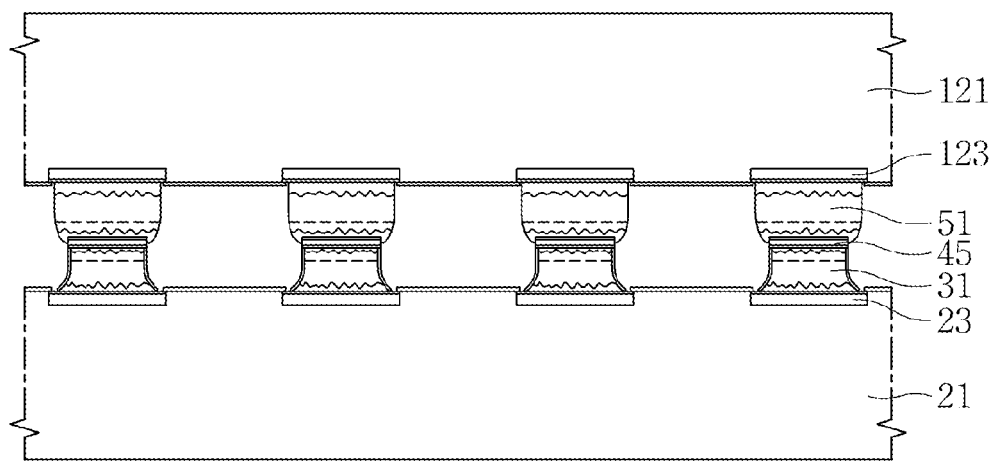

Referring to FIG. 21, the upper semiconductor package 121 may be mounted on the semiconductor package 21. FIG. 9 is an enlarged and more detailed view showing a part of the semiconductor device of FIG. 21. The conductive pad 23, the high-temperature solder 31, the barrier layer 45, the low-temperature solder 51, and the upper conductive pad 123 may be configured similarly to those described in FIG. 9.

Figure 22:
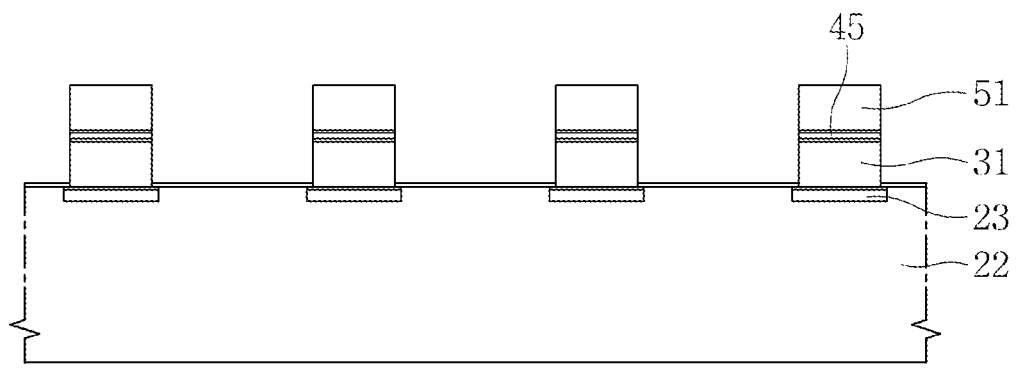

Referring to FIG. 22, the conductive pad 23 may be formed on a semiconductor package 22. The semiconductor package 22 may include a semiconductor wafer or a semiconductor chip. The conductive pad 23 may configured as an RDL. The high-temperature solder 31, the barrier layer 45, and the low-temperature solder 51 may be formed on the conductive pad 23. The high-temperature solder 31, the barrier layer 45, and the low-temperature solder 51 may be configured as a solder bump. A side surface of the high-temperature solder 31 may include a profile that is substantially linear or square and perpendicular to an upper surface of the conductive pad 23.

Figure 23:
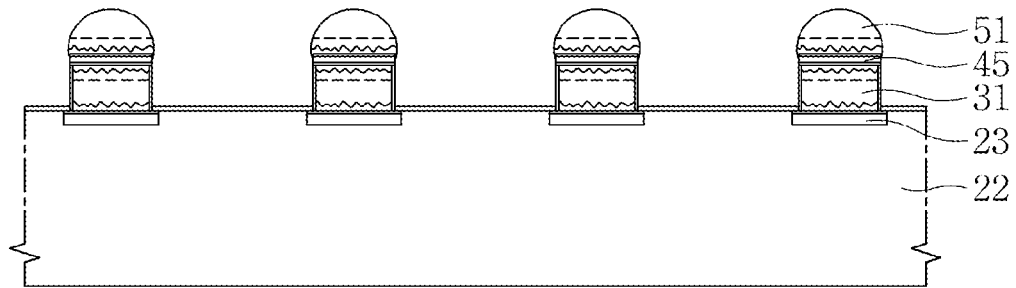

Referring to FIG. 23, a surface of the low-temperature solder 51 may be formed into a rounded shape using a reflow process. FIGS. 6 and 7 are enlarged and more detailed views showing a part of the semiconductor device of FIG. 23. The conductive pad 23, the high-temperature solder 31, the barrier layer 45, and the low-temperature solder 51 may be configured similarly to those described in FIGS. 6 and 7.

Figure 24:
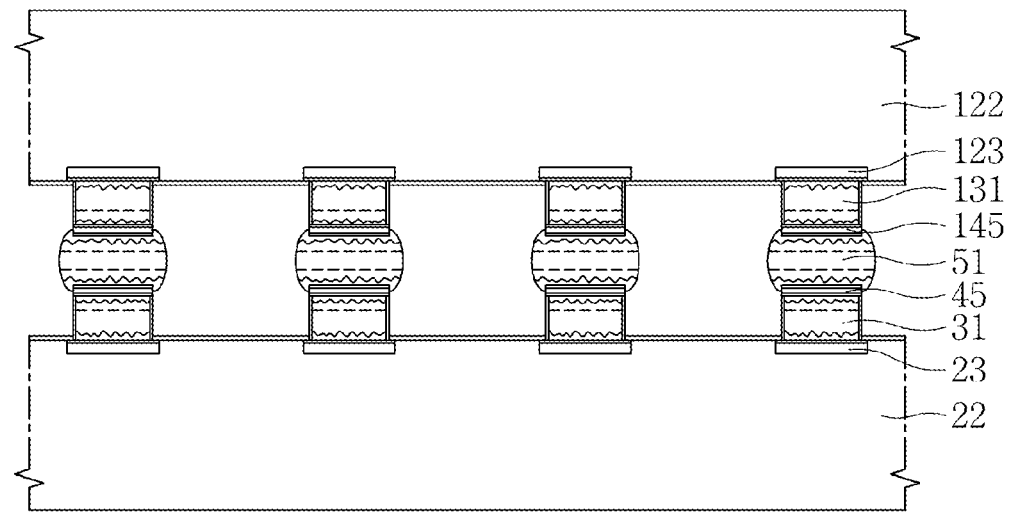

Referring to FIG. 24, an upper semiconductor package 122 may be mounted on the semiconductor package 22. FIG. 11 is an enlarged and more detailed view showing a part of the semiconductor device of FIG. 24. The conductive pad 23, the high-temperature solder 31, the barrier layer 45, the low-temperature solder 51, the upper conductive pad 123, the upper high-temperature solder 131, and the upper barrier layer 145 may be configured similarly to those described in FIG. 11.

Figure 25:
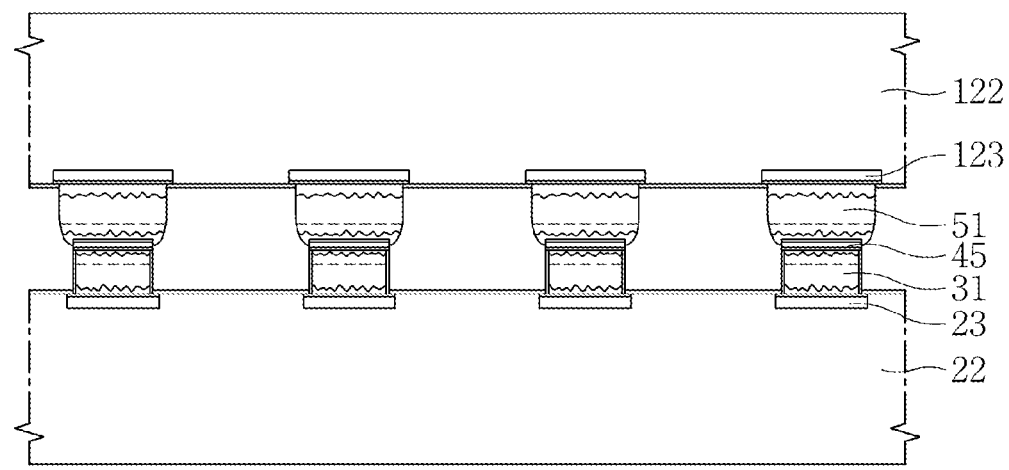

Referring to FIG. 25, the upper semiconductor package 122 may be mounted on the semiconductor package 22. FIG. 12 is an enlarged and more detailed view showing a part of the semiconductor device shown in FIG. 25. The conductive pad 23, the high-temperature solder 31, the barrier layer 45, the low-temperature solder 51, and the upper conductive pad 123 may be configured similarly to those described in FIG. 12.

Figure 26:
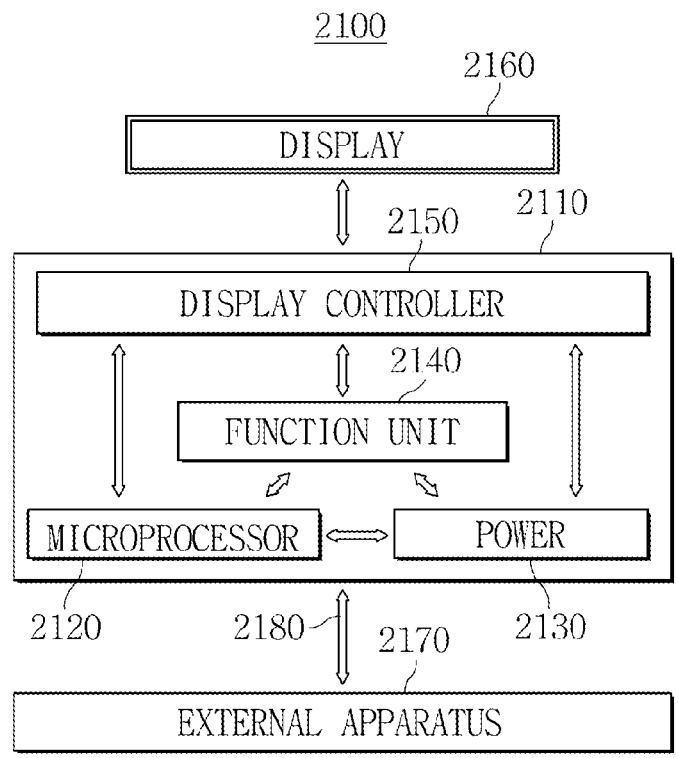
FIGS. 26 and 27 are block diagrams for describing electronic systems in accordance with embodiments of the inventive concept.
Figure 27:
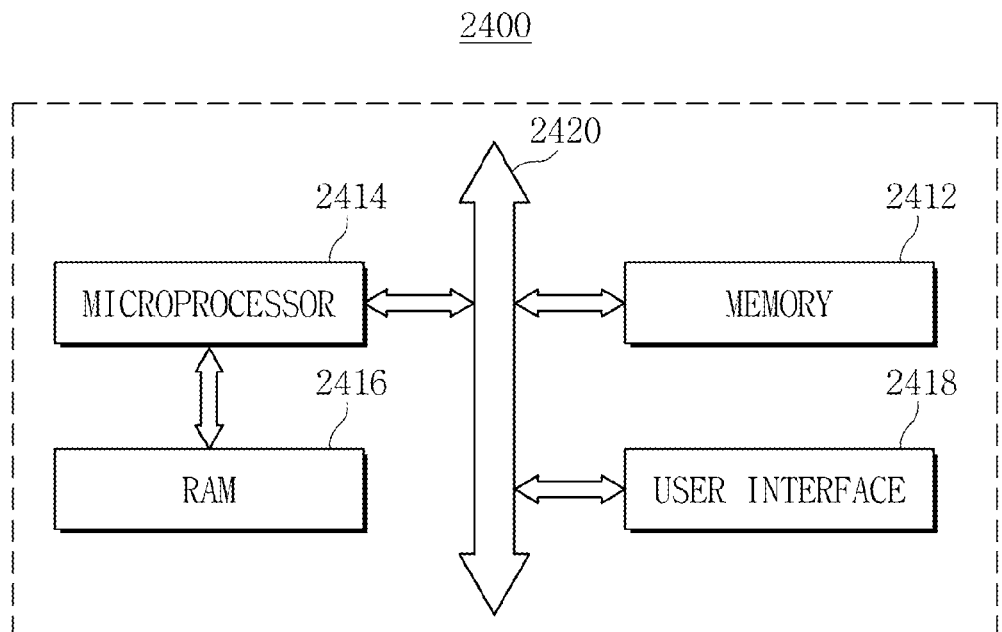

FIGS. 26 to 27 are block diagrams for describing electronic systems in accordance with embodiments of the inventive concept.

Referring to FIG. 26, the semiconductor devices similar to those described with reference to FIGS. 1 to 25 may be applied to an electronic system 2100. The electronic system 2100 may include a body 2110, a microprocessor 2120, a power unit 2130, a function unit 2140, and a display controller 2150. The body 2110 may include a motherboard formed by a printed circuit board (PCB). The microprocessor 2120, the power unit 2130, the function unit 2140, and the display controller 2150 may be disposed on the body 2110. A display 2160 may be disposed inside or outside the body 2110. For example, the display 2160 may be disposed on a surface of the body 2110, and may display an image processed by the display controller 2150.

The power unit 2130 may receive a constant voltage from an external power supply, may divide the voltage into various voltage levels, and may supply the voltages to the microprocessor 2120, the function unit 2140, the display controller 2150, etc. The microprocessor 2120 may receive a voltage from the power unit 2130 to control the function unit 2140 and the display 2160. The function unit 2140 may perform various functions of the electronic system 2100. For example, when the electronic system 2100 is a smart phone, the function unit 2140 may include phone dialing or various components to perform wireless communication functions such as video output to the display 2160 or voice output to a speaker through communication with an external apparatus 2170. When a camera is included, function unit 2140 may serve as a camera pixel data image processor.

In an application embodiment, when the electronic system 2100 is connected to a memory card to expand the memory capacity, the function unit 2140 may be a memory card controller. The function unit 2140 may exchange signals with the external apparatus 2170 through a wired or wireless communication unit or conveyance 2180. Further, when the electronic system 2100 requires a Universal Serial Bus (USB) to expand the functions, the function unit 2140 may serve as an interface controller. In addition, the function unit 2140 may include a mass storage device.

The semiconductor devices similar to those described with reference to FIGS. 1-25 may be applied to the function unit 2140 or to the microprocessor 2120. For example, the microprocessor 2120 may include the conductive pad 23, the high-temperature solder 31, the barrier layer 45, and the low-temperature solder 51.

Referring to FIG. 27, an electronic system 2400 may include at least one of the memory devices in accordance with the embodiments of the inventive concept. The electronic system 2400 may be used to manufacture a mobile device or a computer. For example, the electronic system 2400 may include a memory system 2412, a microprocessor 2414, a RAM 2416, a bus 2420, and a user interface 2418. The microprocessor 2414, the memory system 2412, and the user interface 2418 may be connected to each other through the bus 2420. The user interface 2418 may be used to input or output data to or from the electronic system 2400. The microprocessor 2414 may program and control the electronic system 2400. The RAM 2416 may be used as an operational memory of the microprocessor 2414. The microprocessor 2414, the RAM 2416, and/or other components may be assembled within a single package. The memory system 2412 may store operational codes (e.g. instructions) for execution by the microprocessor 2414, data processed by the microprocessor 2414, or data received from the outside. The memory system 2412 may include a controller and a memory.

The semiconductor devices similar to those described with reference to FIGS. 1 to 25 may be applied to the microprocessor 2414, the RAM 2416, or the memory system 2412.

According to the embodiments of inventive concept, a high-temperature solder, a barrier layer, and a low-temperature solder are sequentially formed on a conductive pad. The high-temperature solder may serve to relieve stress between the conductive pad and the low-temperature solder. The barrier layer may serve to prevent mixing of the high-temperature solder and the low-temperature solder. Thus, a semiconductor device having a high-reliability solder joint can be manufactured.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
a conductive pad;
a high-temperature solder formed on the conductive pad;
a low-temperature solder formed on the high-temperature solder and having a lower melting point than the high-temperature solder; and
a barrier layer formed between the high-temperature solder and the low-temperature solder,
wherein a tin (Sn) content of the high-temperature solder is higher than a tin (Sn) content of the low-temperature solder.

2. The device according to claim 1, wherein the high-temperature solder is pure Sn.

3. The device according to claim 1, wherein the high-temperature solder includes a compound containing an Sn content of 90 percent by weight (wt %) or more.

4. The device according to claim 1, wherein the low-temperature solder includes a flux, whereas the high-temperature solder does not include a flux.

5. The device according to claim 1, further comprising:
a side oxide layer formed on a side surface of the high-temperature solder.

6. The device according to claim 5, wherein the side oxide layer includes tin oxide (SnO).

7. The device according to claim 1, wherein a side surface of the high-temperature solder includes a concave profile, and wherein a side surface of the low-temperature solder includes a convex profile.

8. The device according to claim 1, wherein a profile of a side surface of the high-temperature solder is substantially straight and perpendicular to an upper surface of the conductive pad in a region thereof adjacent to the barrier layer, and wherein a profile of a side surface of the high-temperature solder is concave in a region thereof adjacent to the conductive pad.

9. The device according to claim 1, wherein a side surface of the high-temperature solder includes a profile that is substantially straight and perpendicular to an upper surface of the conductive pad, and wherein a side surface of the low-temperature solder includes a convex profile.

10. The device according to claim 1, further comprising:
a first inter-metallic compound (IMC) formed between the barrier layer and the high-temperature solder; and
a second IMC formed between the barrier layer and the low-temperature solder.

11. The device according to claim 10, wherein the barrier layer comprises:
a first barrier layer; and
a second barrier layer formed on the first barrier layer,
wherein the first barrier layer is thicker than the second barrier layer.

12. The device according to claim 11, wherein the first barrier layer includes nickel (Ni), and wherein the second barrier layer includes bismuth (Bi).

13. The device according to claim 11, further comprising:
a first diffusion region formed between the second IMC and the low-temperature solder,
wherein the first diffusion region includes materials of the second barrier layer and the low-temperature solder.

14. The device according to claim 11, further comprising:
a third barrier layer formed on the first barrier layer,
wherein the first barrier layer is formed between the second barrier layer and the third barrier layer, and
wherein the third barrier layer includes bismuth (Bi).

15. The device according to claim 14, further comprising:
a second diffusion region formed between the first IMC and the high-temperature solder,
wherein the second diffusion region includes materials of the third barrier layer and the high-temperature solder.

16. A semiconductor device, comprising:
a conductive pad formed on a surface of a semiconductor package;
a high-temperature solder formed on the conductive pad;
a low-temperature solder formed on the high-temperature solder and having a lower melting point than the melting point of the high-temperature solder; and
a barrier layer formed between the high-temperature solder and the low-temperature solder,
wherein a side surface of the high-temperature solder has a different shape from that a shape of a side surface of the low-temperature solder.

17. The device according to claim 16, wherein the side surface of the high-temperature solder includes a concave profile.

18. The device according to claim 16, wherein a profile of the side surface of the high-temperature solder is substantially straight and perpendicular to an upper surface of the conductive pad in a region thereof adjacent the barrier layer, and wherein a profile of the side surface of the high-temperature solder is concave in a region thereof adjacent to the conductive pad.

19. The device according to claim 16, wherein the side surface of the low-temperature solder includes a convex profile.

20. The device according to claim 16, wherein the side surface of the high-temperature solder includes a profile that is substantially straight and perpendicular to an upper surface of the conductive pad.

* * * * *